(12) United States Patent
Teague, III

(10) Patent No.: US 6,598,207 B1
(45) Date of Patent: Jul. 22, 2003

(54) SOFTWARE FOR CONVERTING POWER DELIVERY INTERCONNECT MODELING CONNECTIVITY MAPS TO SIMULATION READY INPUT

(75) Inventor: Charles Teague, III, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 252 days.

(21) Appl. No.: 09/608,680

(22) Filed: Jun. 29, 2000

(51) Int. Cl.[7] .............................................. G06F 17/50
(52) U.S. Cl. ................. 716/4; 716/3; 716/18; 703/13
(58) Field of Search ................. 361/393, 306, 361/321, 780, 794; 438/106, 108, 110; 245/500; 364/490, 578; 716/4, 5, 6, 1–3, 17–18, 10–15; 703/13–15, 18

(56) References Cited

U.S. PATENT DOCUMENTS

| | | | |
|---|---|---|---|
| 4,916,576 A | * 4/1990 | Herbert et al. ............... 333/181 |
| 5,099,090 A | * 3/1992 | Allan et al. ............... 106/31.92 |
| 5,848,263 A | * 12/1998 | Oshikiri ......................... 716/3 |
| 5,912,809 A | * 6/1999 | Steigerwald et al. ........ 174/255 |
| 5,946,479 A | * 8/1999 | Sakaguchi et al. ............. 716/20 |
| 5,963,731 A | * 10/1999 | Sagawa et al. ................. 703/6 |
| 5,983,008 A | * 11/1999 | Kumashiro et al. ............ 716/6 |
| 6,009,256 A | * 12/1999 | Tseng et al. ................... 703/13 |
| 6,285,973 B1 | * 9/2001 | Nishino et al. ............... 703/13 |
| 6,300,161 B1 | * 10/2001 | Goetz et al. ................ 257/528 |
| 6,370,678 B1 | * 4/2002 | Culler ......................... 716/18 |

OTHER PUBLICATIONS

Timothy L. Michalka, Modeling the Power Rails in Leading Edge Mircoprocessor Paackages, Jun. 1998, 0–7803–4526–6/98, pp. 598–604.*

M.F. Caggiano, B. DelGiudice, Modeling the Power and Ground Effects of BGA Packages, Sep. 1999, 0–7803–5231–9/99, pp. 1083–1087.*

M.F. Caggiano, B. DelGiudice, Modeling the Power and Ground Effects of BGA Packages, May 2000, vol. 23, No. 2, 1521–3323, pp. 156–163.*

* cited by examiner

Primary Examiner—Matthew Smith
Assistant Examiner—Paul Dinh
(74) Attorney, Agent, or Firm—Blakely, Sokoloff, Taylor & Zafman LLP

(57) ABSTRACT

A method including executing a conversion engine on a data set representing a portion of a circuit and converting the data set from a first file format to a second file format, wherein the second file format is executable on a simulation engine.

16 Claims, 7 Drawing Sheets

| $X   | 1_x         | 12          |             |
    |------|-------------|-------------|-------------|
    | 0    | 1           | 2           | 3           | 4 ← 310
    | 1    | x_3planes2  | x_3planes2  | x_3planes2  |
    | 2    | x_3planes   | x_3planes   | x_3planes   |
    | 3    | x_fr4capa2  | x_fr4capa2  | x_fr4capa2  |
    | 4    | x_fr4capa6  | x_fr4capa6  | x_fr4capa6  |
    | 5    | x_fr4capa6  | x_fr4capa6  | x_fr4capa6  |
    | $end |             |             |             |

FIG. 6A

```
                                                      330 ↗
X1_x0101    120101    120102    x_3planes2
X1_x0102    120102    120103    x_3planes2  ← 332
X1_x0103    120103    120104    x_3planes2
*
X1_x0201    120201    120202    x_3planes
X1_x0202    120202    120203    x_3planes
X1_x0203    120203    120204    x_3planes
*
X1_x0301    120301    120302    x_fr4capa2
X1_x0302    120302    120303    x_fr4capa2
X1_x0303    120303    120304    x_fr4capa2
*
X1_x0401    120401    120402    x_fr4capa6
X1_x0402    120402    120403    x_fr4capa6
X1_x0403    120403    120404    x_fr4capa6
*
X1_x0501    120501    120502    x_fr4capa6
X1_x0502    120502    120503    x_fr4capa6
X1_x0503    120503    120504    x_fr4capa6
```

FIG. 6B

| $Y | 1_x | 12 | |
|---|---|---|---|
| 0 | 1 | 2 | 3 | 4 |
| 1 | y_3planes2 | y_3planes2 | y_3planes2 |
| 2 | y_3planes | y_3planes | y_3planes |
| 3 | y_fr4capa2 | y_fr4capa2 | y_fr4capa2 |
| 4 | y_fr4capa6 | y_fr4capa6 | y_fr4capa6 |
| $end | | | |

FIG. 7A

```
X1_y0101    120101    120201    y_3planes2
X1_y0201    120201    120301    y_3planes
X1_y0301    120301    120401    y_fr4capa2
X1_y0401    120401    120501    y_fr4capa6
*
X1_y0102    120102    120202    y_3planes2
X1_y0202    120202    120302    y_3planes2
X1_y0302    120302    120402    y_fr4capa2
X1_y0402    120402    120502    y_fr4capa6
*
X1_y0103    120103    120203    y_3planes2
X1_y0203    120203    120303    y_3planes
X1_y0303    120303    120403    y_fr4capa2
X1_y0403    120403    120503    y_fr4capa6
*
X1_y0104    120104    120204    y_3planes2
X1_y0204    120204    120304    y_3planes
X1_y0304    120304    120404    y_fr4capa2
X1_y0404    120404    120404    y_fr4capa6
```

FIG. 7B

| $Z | 1_z | 12 | 22 | |
|---|---|---|---|---|
| 0 | 1 | 2 | 3 | 4 |
| 1 | via1 | – | – | – |
| 2 | via1 | – | via1 | – |
| 3 | – | via1 | – | via1 |
| 4 | – | – | – | – |
| $end | | | | |

FIG. 8A

```
X1_z0101    120101 220101    via1
X1_z0201    120201 220201    via1
X1_z0203    120203 220203    via1
X1_z0302    120302 220302    via1
X1_z0304    120304 220304    via1
```

FIG. 8B

SOFTWARE FOR CONVERTING POWER DELIVERY INTERCONNECT MODELING CONNECTIVITY MAPS TO SIMULATION READY INPUT

BACKGROUND OF THE INVENTION

1. Field of the Invention

The invention relates generally to integrated circuit design.

2. Background

The energy requirements of an integrated circuit chip or die is a primary concern to chip designers as is the electrical requirement and function of chip or die packages and their relationship with a printed circuit board. Correctly supplying desired supply voltages to a chip or a package requires careful modeling of the electrical characteristics of the chip or package.

A design group typically designs how a package substrate is laid out with vias, interconnects, pins, etc. following a certain envelope of constraints as guidance (e.g., size of package, number of connecting pins, vias, interconnects, etc.). Once the die and a package for the die are designed, the design is electrically simulated. The simulation involves evaluation of, among other things, the electrical characteristics (capacitance, inductance, resistance, etc.) of, for example, the package.

In a typical chip package, there can be several power/ground planes or networks. Accurate package modeling generally requires modeling of each plane in x, y, and z dimension. Modeling according to a cell-based (e.g., spreadsheet) representation is described in "Modeling the Power Rails in Leading Edge Microprocessor Packages," Michalka, T. L., 1998 Electronic Components and Technology Conference, pp. 598–604. The reference teaches a spreadsheet-style file format with various planes of a chip or package represented by electrical characteristics of nodes of that plane, the cells of a spreadsheet generally corresponding to the nodes of a plane. For a single plane, the cell-based representation will actually have three components, the electrical characteristics attributable to an x-dimension, the electrical characteristics attributable to a y-dimension, and the electrical characteristics attributable to a z-dimension, i.e., three spreadsheets.

Once a model such as described above is created by, for example, a representative spreadsheet, the model is simulated to analyze the electrical characteristics of the individual cells of the spreadsheet (generally corresponding to the nodes of a plane). One way of analyzing the model is through the use of a simulation engine that may form part of an electronic design automation (EDA) system, such as HSPICE™ commercially available from Avant! of Fremont, Calif. or ADS™ from Hewlett Packard Corporation of Palo Alto, Calif. The simulation engine constitutes a software tool that aids in the development of complex electronic systems. The simulation engine, in this embodiment, evaluates the electrical characteristics of a node or cell for, among other things, compliance with Kirchoff's law or Conservation of Energy.

One problem in many modeling systems is that the file format representation of the model is not compatible with the file format of the simulation engine. Thus, to execute the simulation engine, the model must be converted by an operator into an executable file format. Such conversion is usually accomplished by manually re-entering the input data into a file format that the simulation engine can execute. This presents the possibility of introducing errors into the data and delays the design process, particularly where there are a large number of spreadsheet plane models each with potentially thousands of cell data that must be re-entered. What is needed is a technique to improve the accuracy and efficiency of this conversion.

DETAILED DESCRIPTION OF THE INVENTION

The invention relates, in one aspect, to a method. The method includes executing a conversion engine on a data set representing a portion of a circuit, and converting the data set from a first file format to a second file format. In one embodiment, the data set presented in the second file format is executable on a simulation engine. According to a method of the invention, the method addresses the need for an electronic conversion of a data set such as an electrical characteristics model from a spreadsheet data set to a data set executable by a simulation engine.

In another aspect, the invention relates to machine readable storage medium containing executable program instructions that when executed cause a digital processing system to perform a method. The method includes executing a conversion engine on a data set representing a portion of a circuit, and converting the data set from a first file format to a second file format. The converted data set, in one embodiment, is executable on a simulation engine. The program instructions provide a designer with the ability to model a circuit using a conventional spreadsheet array, without the need to subsequently manually translate the data set into a file format executable by a simulation engine.

In the context of the invention, a suitable digital processing system to, for example, execute the program instructions of the machine readable storage medium includes a computer system having a processor, a storage device, and an interconnect such as a bus or a point-to-point link. The processor is coupled to the storage device by the interconnect. In addition, a number of user input/output devices, such as a keyboard and a display, are coupled to a chip set (not shown) which is then connected to the processor.

A suitable processor includes a central processing unit of any type of architecture (e.g., the Intel architecture, Hewlett Packard architecture, Sun Microsystems architecture, IBM architecture, etc.), or hybrid architecture. In addition, the processor could be implemented on one or more chips. The storage device represents one or more mechanisms for storing data. A suitable storage device may include read only memory (ROM), random access memory (RAM), magnetic disk storage mediums, optical storage mediums, flash memory devices, and/or other machine-readable media capable of storing the program instructions described herein. Program instructions represents the necessary code for performing any and/or all of the techniques described. The interconnect represents one or more buses (e.g., accelerated graphics port bus, peripheral component interconnect bus, industry standard architecture bus, X-Bus, video electronics standards association related to buses, etc.) and bridges (also termed as bus controllers). Finally, it is to be appreciated that, although this digital processing system is described in relation to a single processor computer system, the invention could be implemented in a multi-processor computer system or as part of a network.

Figure 1:
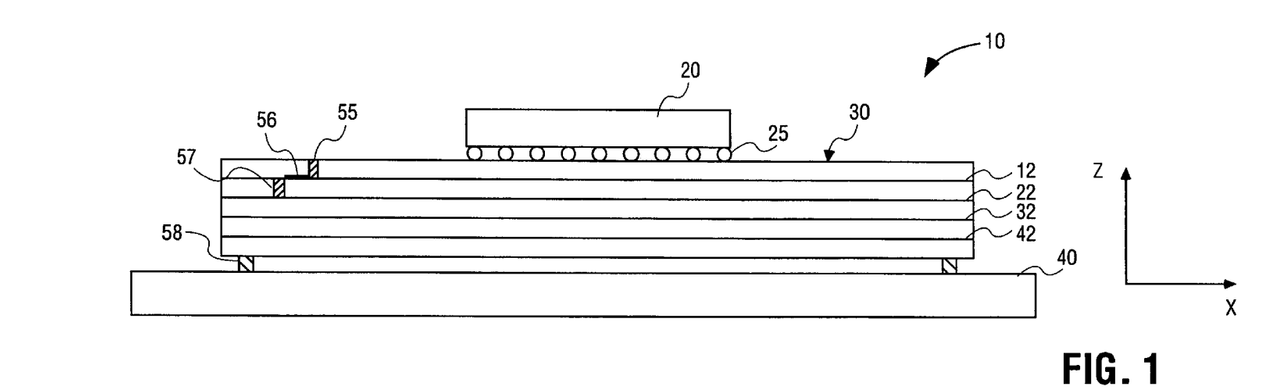
FIG. 1 shows a schematic, cross-sectional side view of a chip coupled to package and coupled to a printed circuit board.

FIG. 1 shows a cross-section of a integrated circuit chip system. Assembly 10 includes chip 20 coupled to package 30 and coupled, through package 30, to circuit board 40. Chip 20 is coupled to a top surface of package 30 through interconnect 25 such as C4 (Controlled Collapsed Chip Connect) coupling in flip-chip arrangement. Suitable chips include state-of-the-art microprocessor chips such as a Pentium III®, commercially available from Intel Corporation of Santa Clara, Calif.

Package 30 is, for example, a conventional chip package used to connect chip 20 to printed circuit board 40. Package 30 is, for example, a multi-layer grid array style package supporting, for example, flip-mounted die or chip 20. In this embodiment, package 30 includes several power/ground planes or networks 12, 22, 32, and 42 that distribute supply voltage throughout the package as necessary. The various power/ground planes 12, 22, 32, and 42 may communicate with one another through vias and traces. FIG. 1 shows conductive via 55 to a top surface of package 30 and coupled to conductive via 57 between power/ground plane 12 and power/ground plane 22 by trace 56.

In the example of chip 20 of a microprocessor, printed circuit board 40 is, for example, a motherboard. Package 30 is coupled to printed circuit board 40 through interconnect such as pins, or a solder connections (e.g., ball grid arrays) as known in the art.

In the following paragraphs, a description of modeling the power/ground planes or networks of package 30 is presented. Also presented is a technique for executing a conversion on a data set representing electrical characteristics of the power/ground plane of package 30 as well as a conversion of the data set from a first file format, such as a conventional spreadsheet format, to a second file format executable on a simulation engine. It is appreciated that the techniques are not limited to package modeling and the conversion may be implemented in other environments such as modeling and converting data sets representative of chip 20 or printed circuit board 40.

Figure 2:
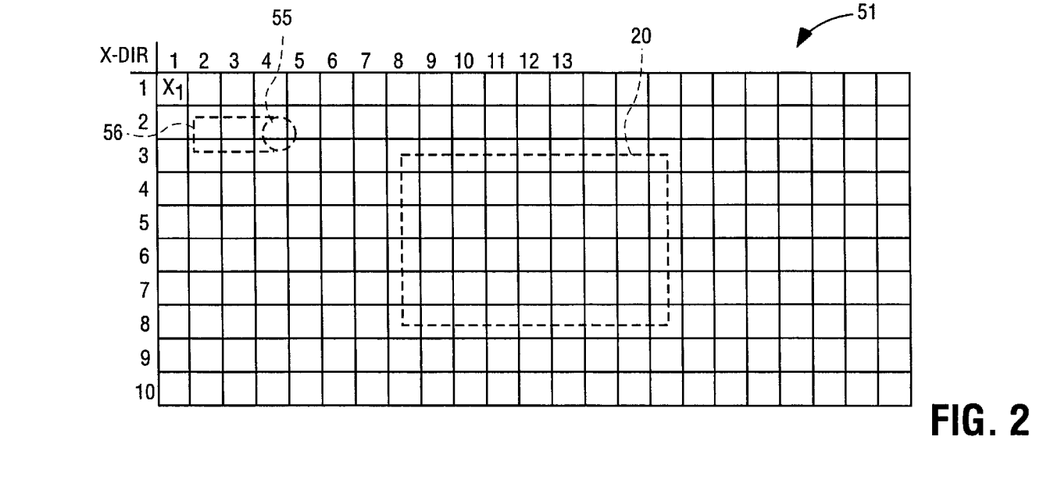
FIG. 2 shows a representative grid array of cells representing a power/ground plane in the package of FIG. 1.

FIG. 2 shows a cell-based, spreadsheet array representation of power/ground plane or network 12. The methodology introduced here to describe the spreadsheet array is similar to that described in "Modeling the Power Rails in Leading Edge Microprocessor Packages," Michalka, T. L., 1998 Electronic Components and Technology Conference, pp. 598–604. The methodology involves a layered array approach designed to logically mimic the physical structure of package 30. The power/ground plane or network Of package 30 are primarily two dimensional in nature and are modeled as an array of nodes laterally interconnected by circuit elements. Interconnections in a third-dimension (e.g., vias, pins, etc.) are implemented with appropriate circuit elements that interconnect nodes in different planes or layers.

For a power/ground plane or network layer such As layer 12 of package 30, properly mapping the electrical characteristics of plane or network 12 may require multiple maps to represent the same plane. Power/ground plane or network 12 generally has electrical characteristics (e.g., resistance, capacitance, inductance, etc.) that affect three dimensions: x, y, and z. FIG. 2 shows a spreadsheet map of the electrical characteristics associated with the x-dimension of power/ground plane or network 12. Representative examples of electrical characteristics that may affect power/ground plane or network 12 include electrical characteristics from chip 20 as well as electrical characteristics from vias 55 and 57 and trace 56.

Referring to FIG. 2, an intersection of the various rows and columns represent nodes identifying areas of, in this example, power/ground plane or network 12. Electrical characteristics representative of the x-dimension for the plane or network are represented in cells adjacent the node. Thus, the cells associated with the node at row 1, column 1 in FIG. 2 is represented by a value, relationship, algorithm, macro, or other representation describing the electrical characteristics of the cell denoted $x_1$. The circuit nodes represented by the remaining cells of the spreadsheet array are completed in a similar fashion. Thus, a designer describes power/ground plane or network 12 in terms of a plurality of circuit nodes with the electrical characteristics of each node represented by an adjacent cell in a spreadsheet. This process is repeated for a y-dimension and a z-dimension for plane or network 12 and then repeated for the other planes or networks of package 30. For a detailed discussion of forming such an array, reference is made to "Modeling the Power Rails in Leading Edge Microprocessor Packages," Michalka, T. L., 1998 Electronic Components and Technology Conference, pp. 598–604.

Figure 3:
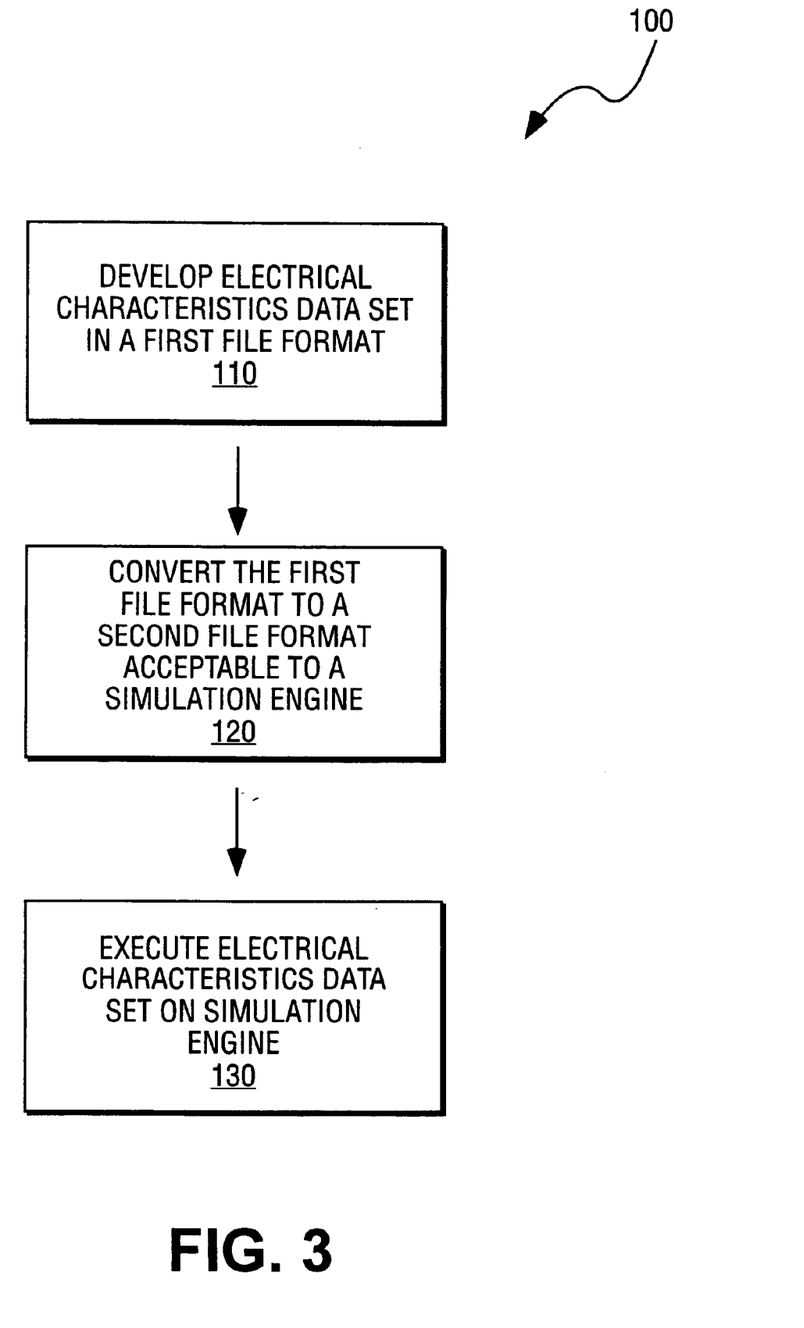
FIG. 3 shows a flow chart of an embodiment of the method of the invention.

FIG. 3 is a flow chart of an embodiment of a method of the invention. Flow chart 100 includes block 110 of developing an electrical characteristic data set in a first file format. As described above with reference to FIG. 2, one file format is a spreadsheet file format representative of circuit nodes of one or more dimensions of a power/ground plane such as power/ground plane 51. A suitable spreadsheet file format is, for example, one constructed from EXCEL™ spreadsheet software, commercially available from Microsoft Corporation of Seattle, Wash. As noted above, in the case of power/ground plane or network 12 of FIG. 1, there may be three spreadsheet files created, one describing electrical characteristics of an x-dimension, another describing the electrical characteristics of a y-dimension, and a third describing the electrical characteristics of a z-dimension.

Once the electrical characteristics of a power/ground plane or network are described as a representative data set in a first file format (of, for example, three spreadsheet files), the first file format is electronically converted to a second file format acceptable to be executed on a simulation engine (block 120). In many instances, it is desirable to execute the data set on more than one simulation engine. Thus, a method that electronically converts the data set of the first file format to a second file format acceptable to a simulation engine or various simulation engines is desirable and taught by the invention.

Figure 4:
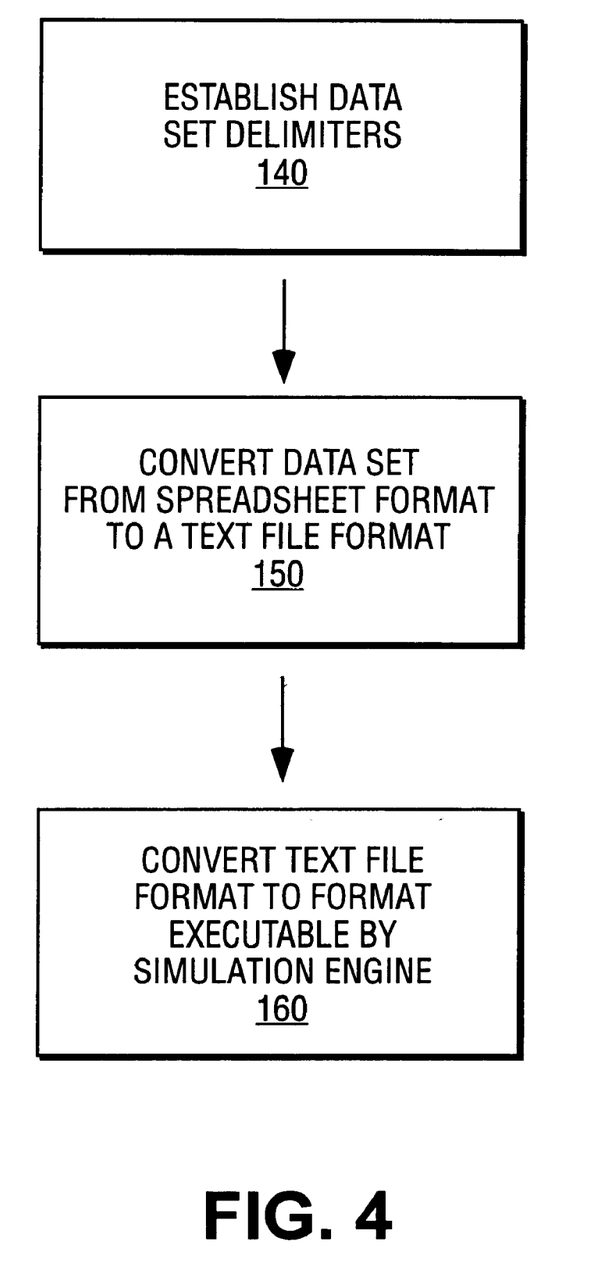
FIG. 4 shows a flow chart describing an embodiment of converting a data set from a first file format to a second file format.

FIG. 4 shows one embodiment of the process of block 120 of converting the first file format to a second file format acceptable for a simulation engine or EDA system.

According to FIG. 4, delimiters are established that identify the data set as a spreadsheet data array (block 140). Table 1 lists a representative set of delimiters.

TABLE 1

Delimiters for Conversion of Spreadsheet Data

| Delimiter | Required Parameters | | Optional Parameters | Description |
| --- | --- | --- | --- | --- |
| $x | node | | network edge_cap_node | X-Direction Map. The optional third parameter specifies whether the last numbered column is used or ignored. By definition, the last numbered column is to be used for edge capacitance, but can be ignored if the third parameter is not specified with the $x delimiter. |
| $y | node | | network N/A | Y-Direction Map. |
| $zo | node | start_network | end_network N/A | Z-Direction Map. |
| $# | N/A | | N/A | Comment Block. Written to the HSpice file as is. For HSpice comments, each line needs to have an * preceding it. |
| $ignore | N/A | | N/A | Ignore Block. For large comments, illustrations, etc. |
| $end | N/A | | N/A | End Of Block. Every block delimiter must have an end block delimiter. |
| # | N/A | | N/A | Comment. Anything following this delimiter to the end of the current line is ignored. |

In one embodiment, the spreadsheet data set is converted from a spreadsheet format to a tab-delimited text file format (block 150). Once a text file format is created (block 150), the text file is converted to a format executable by a simulation engine (block 160).

Figure 5:
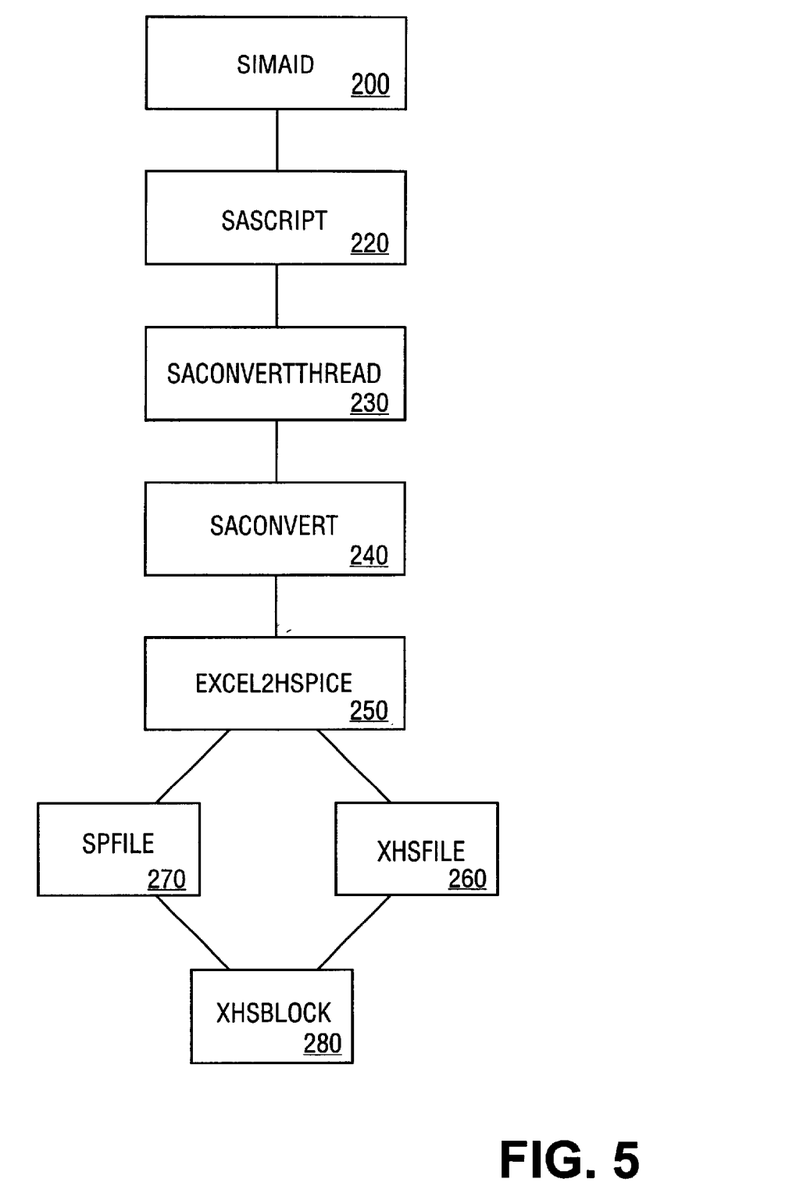
FIG. 5 shows an object oriented paradigm for converting a data set from a first file format to a second file format according to an embodiment of the invention.

FIG. 5 shows an object oriented paradigm (OOP) implementing block 160 of FIG. 4. The OOP may be implemented using conventional programming languages such as JAVA™ or C++. The OOP will be described with reference to converting a tab-delimited text file derived from an EXCEL™ spreadsheet to a file executable on HSPICE™. It is to be appreciated that other input files and output files may be utilized implementing the principles of the invention.

Referring to FIG. 5, block 200 illustrates the creation of a static class SIMAID that contains the main method to start the program. Beginning with the instruction "convert xhs2sp inputfilename.xhs outputfilename.sp," block 200 accepts certain parameters, specifically "convert"; "xhs2sp"; "inputfilename.xhs"; and "outputfilename.sp". Having accepted the parameters, block 200 creates the instance of SASCRIPT and provides the parameters to SASCRIPT (block 220).

SASCRIPT parses through the parameters provided and, in response to the "convert" parameter spawns a convert thread, SACONVERTTHREAD (block 230). SACONVERTTHREAD then receives the other parameters (e.g., "xhs2sp", "inputfilename.xhs", "outputfilename.sp") SACONVERTTHREAD verifies the conversion type (EXCEL™ to HSPICE™) and that an input file exists (e.g., "inputfilename.xhs).

If the conversion type is correct and an input file exists, SACONVERTTHREAD creates an object, SACONVERT, an instance of a convert class (block 240). SACONVERT creates EXCEL2HSPICE Object (block 250). EXCEL2HSPICE Object creates XHSFILE Object (block 260) as a handle that relates to "inputfilename.xhs" file and assigns it a location in memory. EXCEL2HSPICE Object also creates SPFILE Object (block 270) and assigns it a location in memory. SPFILE Object will receive the converted file (e.g., "outputfile.sp").

Referring to block 260, XHSFILE Object reads the input file to be converted until it encounters a delimiter (e.g., $x, $y, #, $#, etc.). The delimiter signals the creation of XHS-BLOCK (block 280). XHSBLOCK reads from the input file that XHSFILE Object represents in a particular manner, such as two-dimensional array corresponding to the data of "inputfilename.xhs." XHSBLOCK writes to SPFILE Object in a format compatible with the desired simulation engine implementation (e.g., HSPICE™) in a manner described below. When XHSBLOCK encounters a delimiter informing of the end of a block (e.g., $end), the read and write is terminated and XHSFILE Object continues reading.

In the context of a read, XHSBLOCK establishes a block type. If the data is delimited as a comment, XHSBLOCK reads the comment into an array of strings that are ignored by the simulation engine upon execution of "outputfilename.sp." If the data corresponds to electrical characteristics of a lateral network (x-dimension, y-dimension) or a vertical network (z-dimension), identified by parameters, the parameters are read into an array of strings to be used as data members referencing the electrical characteristics. XHSBLOCK thus determines the block type (x, y, z). XHSBLOCK also counts the number of rows and columns to establish the size of a block where reading the electrical characteristic data as a two-dimensional array. A representative example of XHSBLOCK read and write loops written in JAVA™ is presented in Appendix A.

Figure 6A:
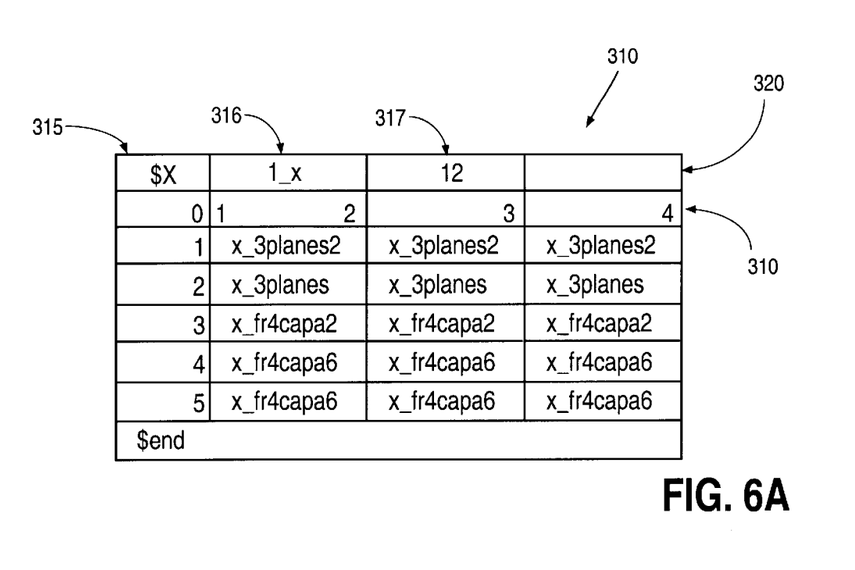
FIG. 6A shows representative spreadsheet data of x-dimension electrical characteristics data for a plane or network of a package according to an embodiment of the invention.
Figure 6B:
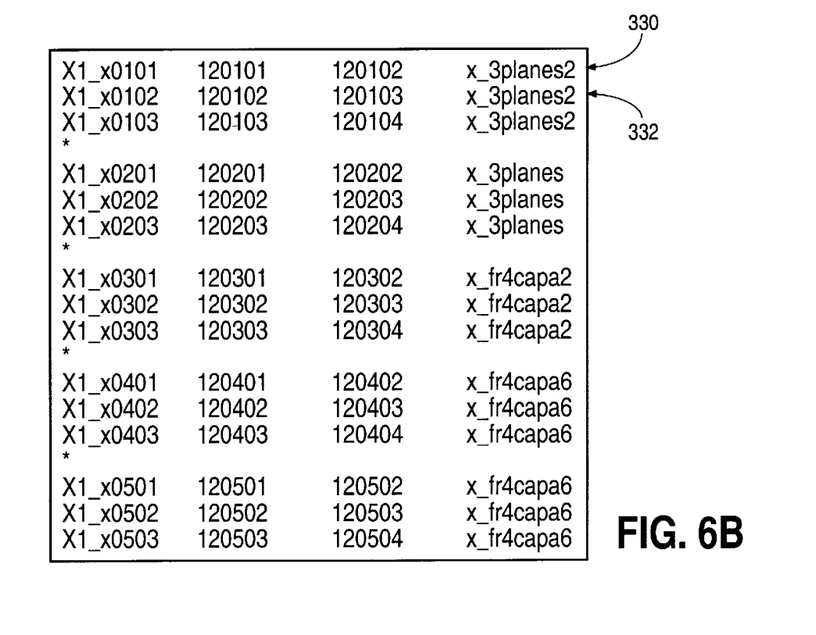
FIG. 6B shows a data set executable by a simulation engine corresponding to the spreadsheet data of FIG. 6A.
Figure 7A:
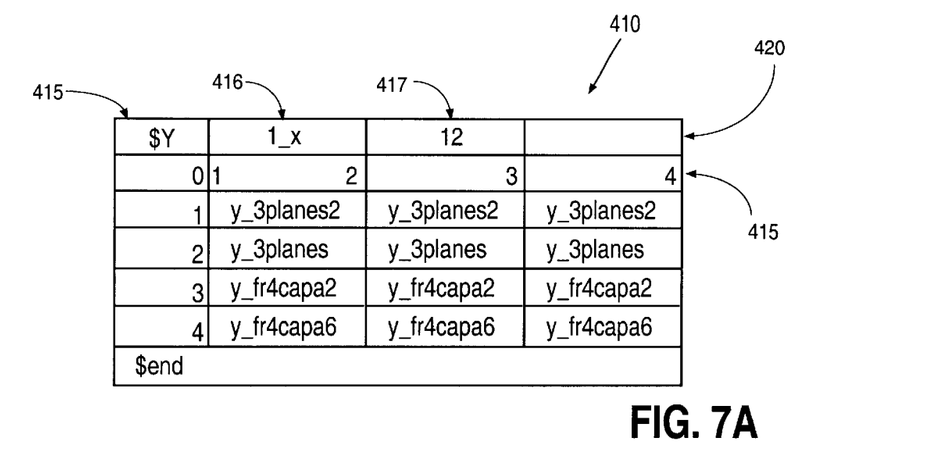
FIG. 7A shows representative spreadsheet data of y-dimension electrical characteristics data for a plane or network of a package according to an embodiment of the invention.
Figure 7B:
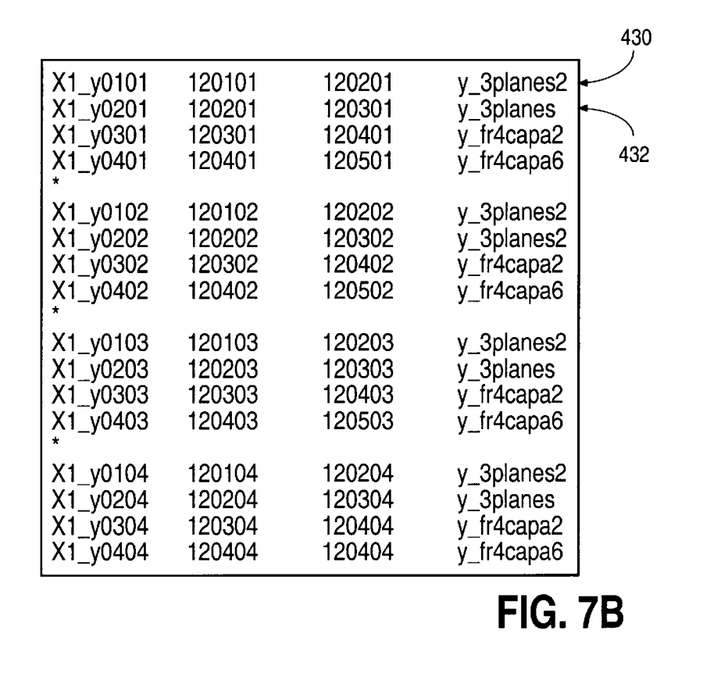
FIG. 7B shows a data set executable by a simulation engine corresponding to the spreadsheet data of FIG. 7A.
Figure 8A:
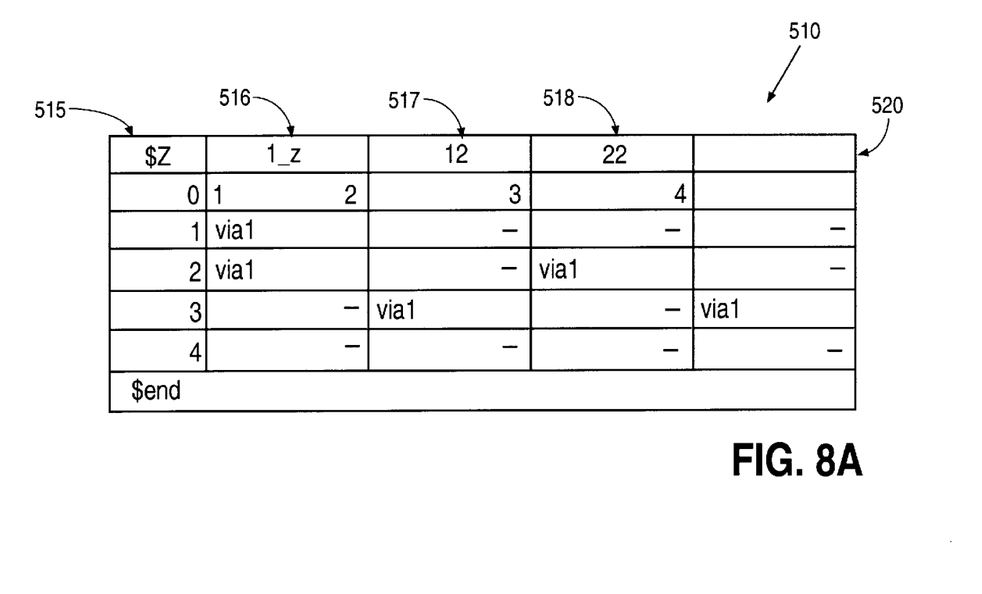
FIG. 8A shows representative spreadsheet data of z-dimension electrical characteristics associated with planes or networks of a package according to an embodiment of the invention.
Figure 8B:
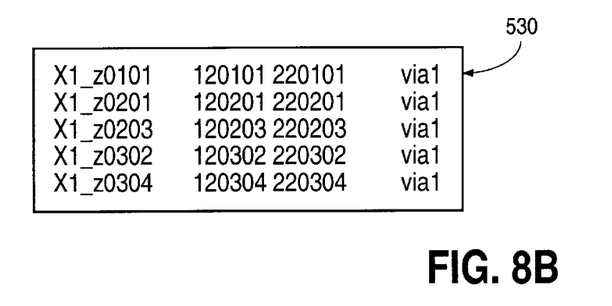
FIG. 8B shows a data set executable by a simulation engine corresponding to the spreadsheet data of FIG. 8A.

FIGS. 6A–8B illustrate representative conversions of electrical characteristic data in a spreadsheet format to a file format suitable for execution on an HSPICE™ simulation engine for a portion of a package plane (e.g., plane or network 12 in FIG. 1). FIGS. 6A and 6B shows x-dimension electrical characteristic data in spreadsheet and HSPICE™ formats, respectively; FIGS. 7A and 7B show y-dimension electrical characteristic data; and FIGS. 8A and 8B shows z-dimension electrical characteristic data.

Referring to FIG. 6A, spreadsheet data 310 is implemented for example, in EXCEL™. The first row of the spreadsheet data designates certain parameters 320, including dimension 315, entry/name 316, and network or plane 317 (e.g., plane or network). The data corresponding to the electrical characteristics in an x-dimension for a plane is set off in a series of rows and columns, beginning from an upper leftmost 0. The intersection of rows and columns identify nodes. The representative data (e.g., value, algorithm, macro, etc.) located between node 0101 (row column) and 0102, in this example, is "x_3planes2." The representative data located between node 0201 and 0202 is "x_3planes."

Referring to FIG. 6B, the corresponding converted data is set forth. According to the invention, while writing the data into, for example, SPFILE, the two-dimensional array is traversed column-by-column for an x-dimension. Thus, row 330 contains the representative data located between node 0101 and 0102; row 332 contains the representative data located between node 0102 and 0103, etc.

In FIG. 6B, row 330 contains a data set of four entries. The first entry "X1_x0101" identifies the data set as HSPICE™ format. The second entry, "120101," identifies the plane or network ("12") and a node location boundary ("0101") for the electrical characteristics data. The third entry, "120102," identifies the plane or network ("12") and a second node location boundary ("0102") for the electrical characteristics data. The fourth entry, "x_3planes2," sets forth the electrical characteristics data between the node location boundaries.

FIG. 7A presents spreadsheet data 410 implemented, for example, in EXCEL™, of y-dimension electrical characteristics data for network or plane 12. The first row of the spreadsheet data designates certain parameters 420, including dimension 415, entry/name 416, and network or plane 417 (e.g., plane or network 12). The data corresponding to the electrical characteristics in a y-dimension for a plane is set off in a series of rows and columns, beginning from an upper leftmost 0.

Referring to FIG. 7B, the corresponding converted data is set forth. According to the invention, while writing the data into, for example, SPFILE, the two-dimensional array is traversed row-by-row for a y-dimension. Thus, row 430 contains the representative data located between node 0101 and 0201; row 432 contains the representative data located between node 0201 and 0301; etc.

In FIG. 7B, row 430 contains a data set of four entries. The first entry, "X1_y0101," identifies the data set as HSPICE™ format. The second entry, "120101," identifies the plane or network ("12") and a second node location boundary ("0201") for the electrical characteristics data. The fourth entry, "y_3planes2," sets forth the electrical characteristics data between the node location boundaries.

FIG. 8A presents spreadsheet data 510 implemented, for example, in EXCEL™, of z-dimension electrical characteristics data. Since, with reference to FIG. 1, z-dimension data represents vertical electrical characteristics, the spreadsheet data, in this example, represents data between planes or networks (e.g., between plane or network 12 and plane or network 22). The first row of the spreadsheet data designates certain parameters 520, including dimension 515, entry/name 516, first network or plane 517 (e.g., 12) and second network or plane 518 (e.g., 22). The data corresponding to the electrical characteristics in a z-dimension for a plane is set off in a series of rows and columns, beginning from an upper leftmost 0. Where there is not electrical characteristics data corresponding to a given cell in the spreadsheet, the cell is represented by a "–".

Referring to FIG. 8B, the corresponding converted data is set forth. According to the invention, while writing the data into, for example, SPFILE, the two-dimensional array is traversed column-by-column for a z-dimension. Where there is no electrical characteristics data, no data is entered into, for example, SPFILE.

In FIG. 8B, row 530 contains a data set of four entries. The first entry, "X1_z0101," identifies the data set as HSPICE™ format. The second entry, "120101," identifies a first plane or network ("12") and a node location boundary ("0101") for the electrical characteristics data. The third entry, "220101," identifies a second plane or network ("22") and a second node location boundary ("0101") for the electrical characteristics data. The fourth entry, "vial," sets forth the electrical characteristics data between the node boundaries.

The invention addresses the need for an electronic conversion of a data set, including electrical characteristics modeling data to a data set executable by a simulation engine. In this regard, the invention replaces prior art manual re-entry of data in a desired format, thus increasing the efficiency of modeling and simulating and reducing the possibility of errors.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

APPENDIX A

Representative Read Loop and Write Loop

```
class XHSBlock{
    private SAFileIO xhsFile;
    private String[] parmList;
    private String blockType;
    private LinkedList blockList;
    private String[][] block;
    private LinkedList commentBlock;
    public XHSBlock(){
        this(null);
    }//XHSBlock constructor
```

APPENDIX A-continued

Representative Read Loop and Write Loop

```
    public XHSBlock(SAFileIO blockFile){
        this.setXHSFile(blockFile);
        blockList=new LinkedList();
    }//XHSBlock constructor
    public void readBlock(SAFileIO blockFile){
        this.setXHSFile(blockFile);
        this.readBlock();
    }//readBlock method
    public void readBlock(){
        XHSBlock xhsBlock;
        String[] blockRow;
        LinkedList blockColumns;
        int columns=0;
        boolean blockEndFound=false;
        String prevDelimiter;
if(this.getXHSFile()!=null&&!this.getXHSFile() .isEOF()&&this.getXHSFile(
) .isValidEntry()){
            prevDelimiter=this.getXHSFile() .getDelimiter();
            this.getXHSFile() .setDelimiter(" \t\"");
if(this.getXHSFile() .getCurrToken() .toUpperCase() .startsWith(XHSFile.BLO
CK_DESIG)&&!this.getXHSFile() .getCurrToken() .toUpperCase() .startsWith(XH
SFile.BLOCK_END))){
this.setBlockType(this.getXHSFile() .getCurrToken() .toUpperCase());
                //System.out.print(this.getBlockType());
                if(this.getBlockType() .equalsIgnoreCase(XHSFile.BLOCK_COMMENT)){
                    commentBlock=new LinkedList();
                    if(this.getXHSFile() .getCurrLine() .trim() .startsWith("\"")){
if(this.getXHSFile() .getCurrLine() .trim() .lastIndexOf("\"")==this.getXHS
File() .getCurrLine() .trim() .length()-1){
commentBlock.add(this.getXHSFile() .getCurrLine() .substring(this.getXHSFi
le() .getCurrLine() .indexOf(XHSFile.BLOCK_COMMENT)+2,this.getXHSFile() .ge
tCurrLine() .lastIndexOf("\"")));
                        }//if Excel appended a double-quote
                    }//if Excel appended a double-quote to this comment,
arrrgghhh!!!"
                    else{
commentBlock.add(this.getXHSFile() .getCurrLine() .substring(this.getXHSFi
le() .getCurrLine() .indexOf(XHSFile.BLOCK_COMMENT)+2));
                    }//otherwise, just add the line minus the comment delimiter
                }//if this is a new comment block
                else
if(this.getBlockType() .equalsIgnoreCase(XHSFile.BLOCK_X)||this.getBlockT
ype() .equalsIgnoreCase(XHSFile.BLOCK_Y)||this.getBlockType() .equalsIgnor
eCase(XHSFile.BLOCK_ZO))){
                    int parms=this.getXHSFile() .getTokenCount();
                    this.parmList=new String[parms];
                    for(int i=0;i<parms;i++){
                        parmList[i]=this.getXHSFile() .nextToken();
                    }//for each parameter
                }//else-if this is a connectivity block
                blockColumns=new LinkedList();
                do{
                    this.getXHSFile() .nextLine();
                    if(!this.getXHSFile() .isEOF()){
if(this.getXHSFile() .isValidEntry()&&this.getXHSFile() .getTokenCount()>0
){
if(this.getXHSFile() .nextToken() .toUpperCase() .startsWith(XHSFile.BLOCK_
DESIG)&&!this.getXHSFile() .getCurrToken() .toUpperCase() .startsWith(XHSFi
le.BLOCK_END))){
                            xhsBlock=new XHSBlock(xhsFile);
                            xhsBlock.readBlock();
                            blockList.add(xhsBlock);
                        }//if a nested BLOCK_DESIG was found
                        else{
if(this.getXHSFile() .getCurrToken() .toUpperCase() .startsWith(XHSFile.BLO
CK_END))){
                            blockEndFound=true;
if(this.getBlockType() .equalsIgnoreCase(XHSFile.BLOCK_X)||this.getBlockT
ype() .equalsIgnoreCase(XHSFile.BLOCK_Y)||this.getBlockType() .equalsIgnor
eCase(XHSFile.BLOCK_ZO))){
                                block=new String[blockColumns.size()][columns];
                                int numColumns=blockColumns.size();
                                for(int j=0;j<numColumns;j++){
                                    block[j]=(String[])blockColumns.removeFirst();
                                }//for each blockColumn
```

APPENDIX A-continued

Representative Read Loop and Write Loop

```
                        }//if X or Y or ZO block ended
                    }//if blockEnd was found
                    else
if(this.getXHSFile() .getCurrToken() .toUpperCase() .startsWith(XHSFile.COM
MENT_DESIG)){
                            //do nothing for this case . . .
                    }//else-if a comment was found
                    else
if(this.getBlockType() .equalsIgnoreCase(XHSFile.BLOCK_COMMENT)){
if(this.getXHSFile() .getCurrLine() .trim() .startsWith("\"")){
if(this.getXHSFile() .getCurrLine() .trim() .lastIndexOf("\"")==this.getXHS
File() .getCurrLine() .trim() .length()-1){
commentBlock.add(this.getXHSFile() .getCurrLine() .substring(this.getXHSFi
le() .getCurrLine() .indexOf("\"")+1,this.getXHSFile() .getCurrLine() .lastI
ndexOf("\"")));
                            }//if Excel appended a double-quote
                        }//if Excel appended a double-quote to the end of this
comment, arrrgghhh!!!"
                        else{
commentBlock.add(this.getXHSFile() .getCurrLine() .substring(this.getXHSFi
le() .getCurrLine() .indexOf("\"")+1));
                        }//otherwise, just add the line minus the comment
delimiter
                    }//else-if comment block line was found
                    else
if(this.getBlockType() .equalsIgnoreCase(XHSFile.BLOCK_X)||this.getBlockT
ype() .equalsIgnoreCase(XHSFile.BLOCK_Y)||this.getBlockType() .equalsIgnor
eCase(XHSFile.BLOCK_ZO))){
                            if(this.getXHSFile() .getCurrToken() .startsWith("0")){
                                columns=this.getXHSFile() .getTokenCount();
                                this.getXHSFile() .nextLine();
                                this.getXHSFile() .nextToken();
                            }//if at the beginning of the block
                            if(columns<=this.getXHSFile() .getTokenCount()){
                                blockRow=new String[columns];
                                for(int i=0;i<columns;i++){
                                    blockRow[i]=this.getXHSFile() .nextToken();
                                }//for each column found in the numbered row
                                blockColumns.add(blockRow);
                            }//if the current matrix was built correctly
                        }//else-if X, Y, or ZO block was found
                    }//build the current block
                }//if validEntry found && tokenCount>0
                else
if(this.getBlockType() .equalsIgnoreCase(XHSFile.BLOCK_COMMENT)){
                    commentBlock.add(this.getXHSFile() .getCurrLine());
                }//else-if currently reading a comment block
            }//if !EOF
        }//do while !EOF and !blockEndFound
        while(!this.getXHSFile() .isEOF()&&!blockEndFound);
    }//if a valid BLOCK_DESIG was found && !BLOCK_END
    this.getXHSFile() .setDelimiter(prevDelimiter);
}//if current file !null && !EOF && validEntry found
}//readBlock method
public void writeBlockToSPFile(SAFileIO spFile){
    XHSBlock xhsBlock;
    String commentLine;
    String row,column,nextColumn;
    boolean written=false;
    while(blockList.size()>0){
        xhsBlock=(XHSBlock)blockList.removeFirst();
        xhsBlock.writeBlockToSPFile(spFile);
    }//while there are blocks in the list
    if(this.getBlockType() .equalsIgnoreCase(XHSFile.BLOCK_COMMENT)){
        while(commentBlock.size()>0){
            commentLine=(String)commentBlock.removeFirst();
            spFile.writeln(commentLine);
        }//while there are lines left in the comment block
    }//if this is a comment block
    else
if(this.getBlockType() .equalsIgnoreCase(XHSFile.BLOCK_X)||this.getBlockT
ype() .equalsIgnoreCase(XHSFile.BLOCK_ZO))){
        for(int i=0;i<block.length;i++){
            written=false;
            for(int j=0;j<block[i].length;j++){
                try{
                    if(i<9){
```

APPENDIX A-continued

Representative Read Loop and Write Loop

```
                                row="0"+(i+1);
                        }//if i is less than two digits, buffer a zero
                        else{
                                row=Integer.toString(i+1);
                        }//otherwise, use the the available digits
                        if(j<9){
                                column="0"+(j+1);
                                if(j<8){
                                        nextColumn="0"+(j+2);
                                }//if j is less than two digits
                                else{
                                        nextColumn=Integer.toString(j+2);
                                }//otherwise, use the available digits
                        }//if j is less than two digits, buffer a zero
                        else{
                                column=Integer.toString(j+1);
                                nextColumn=Integer.toString(j+2);
                        }//otherwise, use the the available digits
                        if(this.getBlockType() .equalsIgnoreCase(XHSFile.BLOCK_X)){
                                if(j==block[i].length-1){
                                        if(parmList.length>3){
                                                spFile.writeln("X"+parmList[3]+row+""+column+"
"+parmList[2]+row+""+column+"
"+0+GenStringUtil.getStringOf((parmList[2].length()+row.length()+column.
length())-1," ")+" "+block[i][j]);
                                        }//if there is a parameter for the capedge connect,
otherwise do not write a capedge value
                                }//if on the last cell, or the capedge connect
                                else{
                                        spFile.writeln("X"+parmList[1]+row+""+column+"
"+parmList[2]+row+""+column+" "+parmList[2]+row+""+nextColumn+"
"+block[i][j]);
                                }//else, just write the cell out
                                written=true;
                        }//if this is an X block
                        else
if(this.getBlockType() .equalsIgnoreCase(XHSFile.BLOCK_ZO)){
                                if(!this.block[i][j].startsWith("-")){
                                        spFile.writeln("X"+parmList[1]+row+""+column+"
"+parmList[2]+row+""+column+" "+parmList[3]+row+""+column+"
"+block[i][j]);
                                        written=true;
                                }//if the cell has a connection across the layers
                        }//else-if this is a ZO block
                }//try to write the block
                catch(ArrayIndexOutOfBoundsException e){
                        System.out.println("Error writing to file.");
                }//report the error.
        }//for each column in the block
        if(written){
                spFile.writeln("*");
        }//if any of this block was written, write a delimiter '*'
    }//for each row in the block
}//else-if X or ZO block
else if(this.getBlockType() .equalsIgnoreCase(XHSFile.BLOCK_Y)){
        written=false;
        for(int i=0;i<block[0].length;i++){
                for(int j=0;j<block.length;j++){
                        try{
                                if(i<9){
                                        row="0"+(i+1);
                                }//if i is less than two digits
                                else{
                                        row=Integer.toString(i+1);
                                }//otherwise, use the the available digits
                                if(j<9){
                                        column="0"+(j+1);
                                        if(j<8){
                                                nextColumn="0"+(j+2);
                                        }//if j is less than two digits
                                        else{
                                                nextColumn=Integer.toString(j+2);
                                        }//otherwise, use the available digits
                                }//if j is less than two digits
                                else{
                                        column=Integer.toString(j+1);
                                        nextColumn=Integer.toString(j+2);
```

APPENDIX A-continued

Representative Read Loop and Write Loop

```
                }//otherwise, use the the available digits
                    spFile.writeln("X"+parmList[1]+column+""+row+"
"+parmList[2]+column+""+row+" "+parmList[2]+nextColumn+""+row+"
"+block[j][i]);
                    written=true;
                }//try to write the line
                catch(ArrayIndexOutOfBoundsException e){
                    System.out.println("Error writing to file.");
                }//report the error
            }//for each row in the block
            if(written){
                spFile.writeln("*");
            }//if this line was written, write a delimiter '*'
        }//for each column in the block
    }//else if Y block
    else if(this.getBlockType() .equalsIgnoreCase(XHSFile.BLOCK_ZI)){
    }//else if ZI block
}//writeBlock method
public void setXHSFile(SAFileIO blockFile){
    xhsFile=blockFile;
}//setXHSFile method
public SAFileIO getXHSFile(){
    return(xhsFile);
}//getXHSFile method
public void setBlockType(String thisType){
if(thisType!=null&&thisType.toUpperCase() .startsWith(XHSFile.BLOCK_DESIG
.toUpperCase())){
            if(thisType.toUpperCase() .startsWith(XHSFile.BLOCK_COMMENT)){
                blockType=XHSFile.BLOCK_COMMENT;
            }//if comment block was found
            else if(thisType.toUpperCase() .startsWith(XHSFile.BLOCK_IGNORE)){
                blockType=XHSFile.BLOCK_IGNORE;
            }//else-if ignore block was found
            else if(thisType.toUpperCase() .startsWith(XHSFile.BLOCK_X)){
                blockType=XHSFile.BLOCK_X;
            }//if X connectivity block was found
            else if(thisType.toUpperCase() .startsWith(XHSFile.BLOCK_Y)){
                blockType=XHSFile.BLOCK_Y;
            }//if Y block was found
            else if(thisType.toUpperCase() .startsWith(XHSFile.BLOCK_ZO)){
                blockType=XHSFile.BLOCK_ZO;
            }//if ZO block was found
            else if(thisType.toUpperCase() .startsWith(XHSFile.BLOCK_ZI)){
                blockType=XHSFile.BLOCK_ZI;
            }//if ZI block was found
        }//if thisType isn't null and it starts with the Block designator
    }//setBlockType method
    public String getBlockType(){
        return(blockType);
    }//getBlockType method
}//XHSBlock class
```

What is claimed is:

1. A method comprising:

executing a conversion engine on a data set representing connections between elements of a portion of a circuit; and converting the data set from a first file format to a second file format that is executable on a simulation engine, wherein the portion of the circuit comprises one of an x-dimension, a y-dimension, and a z-dimension representation of the circuit.

2. The method of claim 1, wherein the data set represents electrical characteristics of the portion of the circuit.

3. The method of claim 1, wherein converting comprises: establishing a delimiter identifying a dimension of the data set.

4. The method of claim 3, wherein a portion of the circuit comprises a first portion and the first file format comprises a spreadsheet of a plurality of cells, each cell representing a second portion that is a subset of the first portion and converting comprises:

identifying the number of the plurality of cells.

5. The method of claim 4, wherein converting the data set comprises converting the data set from a spreadsheet format to a text file format and from a text file format to the second file format.

6. The method of claim 4, wherein the portion of the circuit comprises a power and ground plane portion.

7. A method comprising:

executing a conversion engine on a data set representing connections between elements of a power and ground plane portion of a circuit; and converting the data set from a first file format to a second file format executable by a simulation engine, wherein the portion of the circuit comprises one of an x-dimension, a y-dimension, and a z-dimension representation of the circuit.

8. The method of claim 7, wherein converting comprises:

establishing a delimiter identifying a dimension of the data set.

9. The method of claim 8, wherein the first file format comprises a spreadsheet with a cell of the spreadsheet representing a subset of the portion of the circuit and converting comprises:

establishing a delimiter identifying the cell.

10. The method of claim 7, wherein the first file format comprises a spreadsheet and converting the data set comprises converting the data set from a spreadsheet format to a text file format and from a text file format to the second file format.

11. An article of manufacture comprising:

a machine readable storage medium containing executable program instructions which when executed cause a digital processing system to perform a method comprising:

executing a conversion engine on a data set representing connections between elements of a portion of a circuit; and converting the data set from a first file format to a second file format executable by a simulation engine, wherein the portion of the circuit comprises one of an x-dimension, a y-dimension, and a z-dimension representation of the circuit.

12. The storage medium of claim 11, wherein the data set represents electrical characteristics of the portion of the circuit.

13. The storage medium of claim 12, wherein converting comprises:

establishing a delimiter identifying a dimension of the data set.

14. The storage medium of claim 13, wherein a portion of the circuit comprises a first portion and the first file format comprises a spreadsheet of a plurality of cells, each cell representing a second portion that is a subset of the first portion and converting comprises:

identifying the number of the plurality of cells.

15. The storage medium of claim 14, wherein converting the data set comprises converting the data set from a spreadsheet format to a text file format and from a text file format to the second file format.

16. The storage medium of claim 14, wherein the portion of the circuit comprises a power and ground plane portion.

* * * * *

UNITED STATES PATENT AND TRADEMARK OFFICE
CERTIFICATE OF CORRECTION

PATENT NO. : 6,598,207 B1
DATED : July 22, 2003
INVENTOR(S) : Teague, III

It is certified that error appears in the above-identified patent and that said Letters Patent is hereby corrected as shown below:

<u>Column 4,</u>
Line 12, delete "Of", insert -- of --.
Line 19, delete "As", insert -- as --.

Signed and Sealed this

Seventh Day of October, 2003

JAMES E. ROGAN
*Director of the United States Patent and Trademark Office*